(12) United States Patent
Matsuura (10) Patent No.: US 6,856,582 B2
(45) Date of Patent: Feb. 15, 2005

(54) METHOD FOR DRIVING MAGNETIC HEAD AND DRIVING CIRCUIT OF MAGNETO-OPTICAL DISK DRIVE

(75) Inventor: Michio Matsuura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 258 days.

(21) Appl. No.: 10/185,851

(22) Filed: Jun. 27, 2002

(65) Prior Publication Data

US 2003/0007427 A1 Jan. 9, 2003

(30) Foreign Application Priority Data

Jul. 3, 2001 (JP) ........................................ 2001-202626

(51) Int. Cl.$^7$ .............................................. G11B 11/00
(52) U.S. Cl. .................. 369/13.22; 369/13.28
(58) Field of Search ........................... 369/13.02, 13.08, 369/13.09, 13.14, 13.17, 13.26, 13.27, 13.28, 13.32, 13.05, 13.22, 44.29, 44.14, 44.27, 53.34, 47.15, 124.14, 47.28; 428/694 MC, 694 MM (56) References Cited

U.S. PATENT DOCUMENTS 5,060,208 A * 10/1991 Nagai et al. ............. 369/13.27
6,628,574 B1 * 9/2003 Shimazaki et al. ...... 369/13.09

FOREIGN PATENT DOCUMENTS

| JP | 54-025715 | 2/1979 |
| JP | 11250518 | 9/1999 |
| JP | 11306613 | 11/1999 |

* cited by examiner

Primary Examiner—Ali Neyzari
(74) Attorney, Agent, or Firm—Greer, Burns & Crain, Ltd.

(57) ABSTRACT

A driving circuit for a magnetic head that is used for modulating magnetic field in a magneto-optical disk drive is provided, which reduces power consumption even if the magnetic head has large inductance. The driving circuit comprises a switching circuit for generating pulse-like drive current in synchronization with a timing for applying a pulse of light in accordance with a space between pits to be recorded on a magneto-optical disk, and a conversion circuit for converting the pulse-like drive current into sine-wave current to be supplied to the magnetic head such that the maximum magnetic field can be obtained at the timing for applying a pulse of light.

7 Claims, 10 Drawing Sheets

| | Rs | C1 | L2 | C3 | L4 | C5 | L6(=LH/2) | Rt(=RH/2) |
|---|---|---|---|---|---|---|---|---|
| QUADRATIC | 5 | — | — | — | — | (a) 0.1059 | 7.74 | 1 |
| QUARTIC | 5 | — | — | 0.0606 | 3.7818 | (b) 0.2139 | 8.4091 | 1 |
| SEXTIC | 5 | 0.0441 | 2.7343 | 0.1472 | 4.3129 | 0.2103 | 8.3408 | 1 |

METHOD FOR DRIVING MAGNETIC HEAD AND DRIVING CIRCUIT OF MAGNETO-OPTICAL DISK DRIVE

BACKGROUND OF THE INVENTION

1. Field of the Invention

The present invention relates to a method for driving magnetic head that is used for modulating magnetic field in a magneto-optical disk drive and a driving circuit of the same.

2. Description of the Prior Art

A magneto-optical disk can have large capacity by magnetic field modulation record and have relatively high speed data transmission with high reliability (high retention), so it is considered to be one of major storage devices in the future. Along with the recent tendency to a large capacity, a surface recording type magneto-optical disk drive is under eager research and development, which has high speed data transmission performance supporting the large capacity.

The surface recording type magneto-optical disk drive utilizes a method of applying the magnetic field to a medium from the side to which the light is applied, so that a lens and a coil can be combined as a unit. Therefore, the coil can be compact and its inductance can be reduced. As a result, flux reversal speed of the magnetic head can be increased so that the data transmission speed can be faster.

However, the magnetic head of the surface recording type magneto-optical disk drive is made by a thin film technology such as plating into a size of a few hundreds of microns of diameter, so a dc resistance increases and heat is produced more. Though air flowing between the recording medium and the magnetic head can cool the magnetic head, the temperature of the magnetic head may rise over 100 degrees centigrade resulting in undesired heat damage to the recording medium or distortion in an optical system such as a lens. Accordingly, it is an important task to suppress the heat effectively.

In the conventional magneto-optical disk drive, a typical driving method utilizes a rectangular pulse voltage that is applied to the magnetic head so that current is forced to flow through the inductance element. In contrast, as disclosed in Japanese unexamined patent publication No. 54-25715 for example, magnetic recording for a magnetic disk or a magnetic tape adopts a driving method in which pulse current (intermittent current) is supplied to the magnetic head so that power consumption of the magnetic head is reduced.

Also concerning the recording method for a magneto-optical disk, there is a method utilizing pulsed magnetic field as disclosed in Japanese patent No. 2803841.

However, a magneto-optical disk is a removable recording medium. When magneto-optical disks are exposed to ambient air, dust can adhere to recording surfaces of them. In order to prevent the recording surface from being damaged by dust, it is preferable to rotate the magneto-optical disk in the state where the magnetic head (and an optical lens or others) is kept away from the recording surface of the magneto-optical disk by a few tens of microns. In this case, the light beam spot becomes larger than in the levitation method that utilizes a slider. Accordingly, the coil size of the magnetic head should be enlarged. As a result, inductance of the coil increases being proportional to entire flux generation, so the driving method in which pulse-like current is supplied to the magnetic head becomes difficult.

SUMMARY OF THE INVENTION

An object of the present invention is to reduce power consumption in a magnetic head by devising a circuit for supplying drive current to the magnetic head even if the inductance of the magnetic head is large.

According to a first aspect of the present invention, a method for driving a magnetic head that is used for modulating magnetic field in a magneto-optical disk drive is provided. The method comprises the steps of detecting a timing for applying a pulse of light in accordance with a space between pits to be recorded on a magneto-optical disk, and supplying sine-wave current to the magnetic head so that the maximum magnetic field can be obtained at the timing for applying a pulse of light. According to this driving method, the maximum magnetic field is obtained at the timing for applying a pulse of light when sufficient magnetic field is necessary, while drive current is reduced during other period while the magnetic field is not necessary. Therefore, the power consumption of the magnetic head is reduced as a whole.

According to a second aspect of the present invention, a driving circuit for a magnetic head that is used for modulating magnetic field in a magneto-optical disk drive is provided. The driving circuit comprises a switching circuit for generating pulse-like drive current in synchronization with a timing for applying a pulse of light in accordance with a space between pits to be recorded on a magneto-optical disk, and a conversion circuit for converting the pulse-like drive current into sine-wave current such that the maximum magnetic field can be obtained at the timing for applying a pulse of light. By using this driving circuit, the maximum magnetic field is obtained at the timing for applying a pulse of light when sufficient magnetic field is necessary, while drive current is suppressed at low level during other period while the magnetic field is not necessary. Therefore, the power consumption of the magnetic head is reduced as a whole.

In a preferred embodiment, the transfer function of the conversion circuit regarding the current flowing through the magnetic head toward the drive current forms a phase linear filter. The phase linear filter means a filter having a delay time substantially constant with respect to frequency. In other words, phase alters linearly with respect to frequency in the phase linear filter. By using the conversion circuit having such transfer function, it is easy to adjust a peak of the sine-wave current to the timing for applying the pulse of light.

In addition, the pulse width of the pulse-like drive current is preferably 60–80% of pulse generation period. When the pulse width is set to e.g., 70% of the pulse generation period, the power consumption of the magnetic head is reduced in half compared with the case where continuous drive current is supplied.

In another preferred embodiment, the switching circuit includes a plurality of constant current switching circuits connected in parallel and generates the drive current as composite current of a plurality of pulse current obtained from the constant current switching circuits. According to this structure, drive current for the magnetic head can be generated easily by switching the pulse current flowing through two constant current switching circuits using the write clock signal.

DESCRIPTION OF THE PREFERRED EMBODIMENTS

Hereinafter, the present invention will be explained more in detail with reference to embodiments and drawings.

Figure 1:
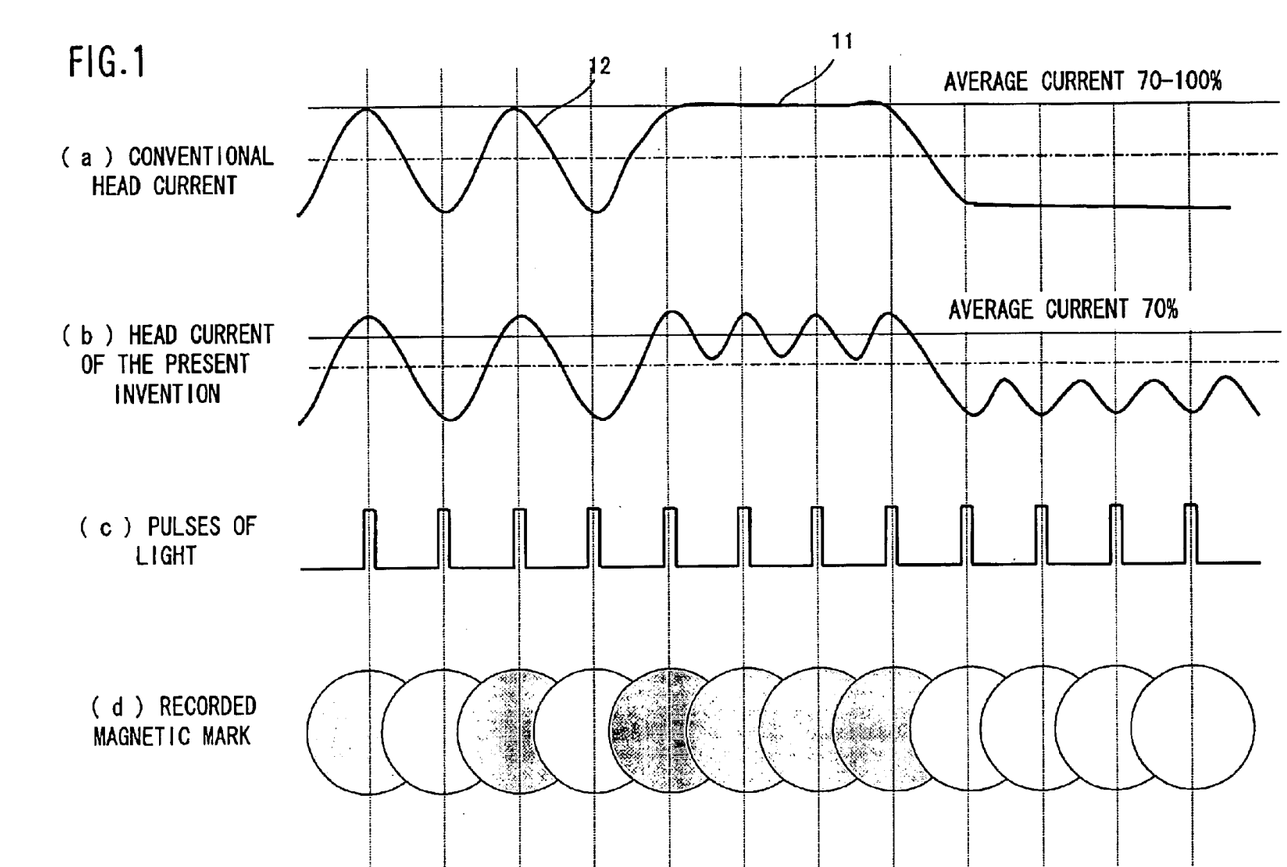
FIG. 1 shows head current in the magnetic head driving method of the present invention in comparison with the head current in the conventional driving method.

FIG. 1 shows current flowing through a magnetic head (hereinafter, this current is referred to as head current) in the magnetic head driving method of the present invention in comparison with the head current in the conventional driving method. The head current (a) in the conventional rectangular pulse drive also varies along a sine wave. It is because that inductance of the magnetic head prevents high frequency components to flow through the magnetic head.

However, the head current (a) has a portion 11 where direct current continues depending on a data pattern. The power consumption Ph (watt) of the magnetic head in this portion is $Ih \times Ih \times Rh$ when the head current is Ih ampere and the head resistance is Rh ohm. In contrast, the power consumption Ph (watt) of the magnetic head in the portion 12 where the sine-wave current flows is $(Ih/\sqrt{2}) \times (Ih/\sqrt{2}) \times Rh = Ih \times Ih \times Rh/2$, which is a half of the power consumption in the portion 11 where direct current continues.

As shown in FIG. 1, the head current (b) in the driving method of the present invention varies in synchronization with the pulses of light (c) so that the maximum magnetic field can be obtained. Namely, there is no portion such as the portion 11 in the head current (a) of the conventional driving method where direct current continues, and average current is controlled to be fewer than 70% of the peak current regardless of a data pattern. Therefore, the power consumption, i.e., heat generation of the magnetic head is reduced by half.

Figure 2:
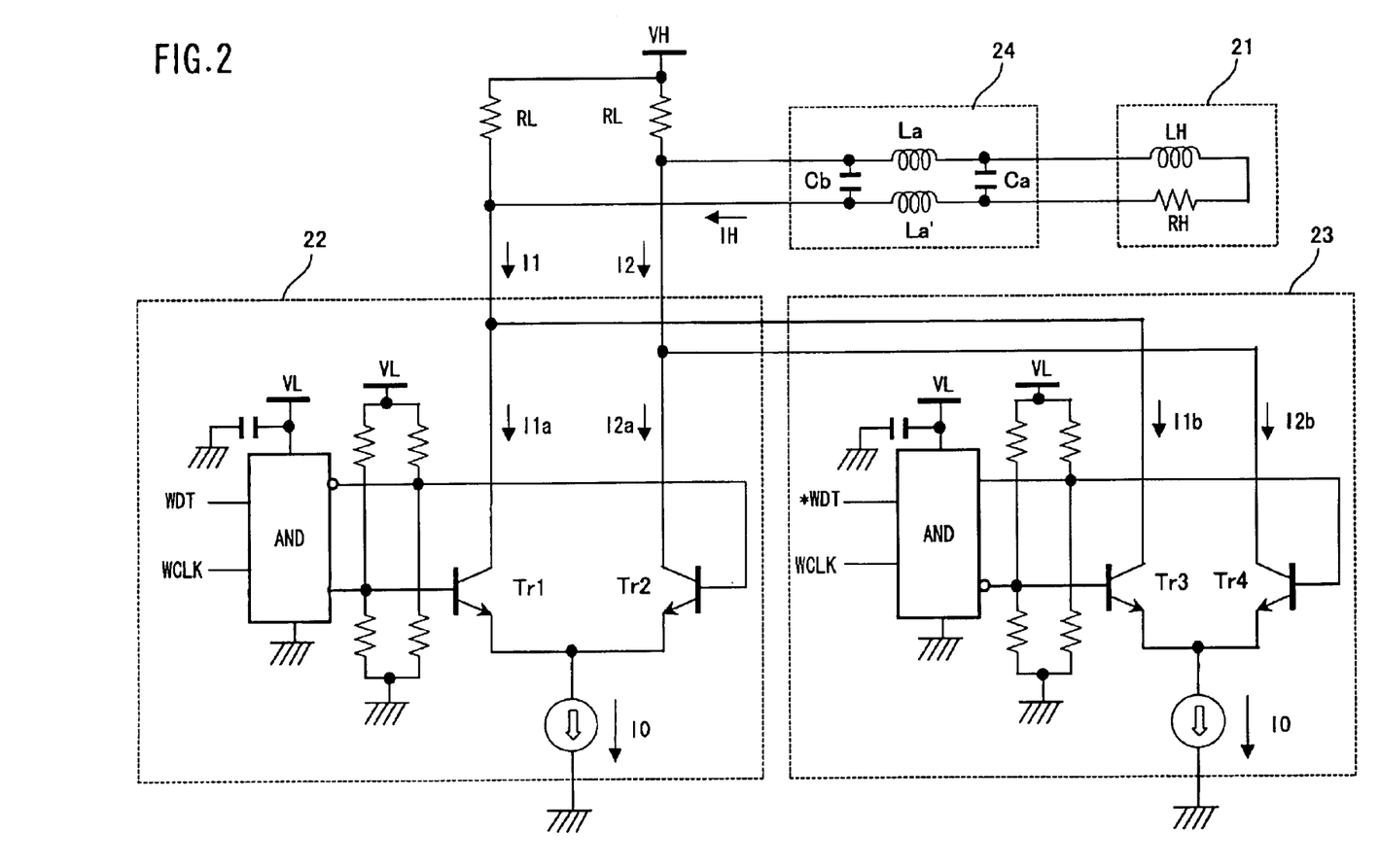
FIG. 2 is a schematic diagram of the magnetic head driving circuit according to a first embodiment of the present invention.

FIG. 2 is a schematic diagram of the magnetic head driving circuit according to a first embodiment of the present invention. The magnetic head 21 is shown as a series circuit made of an inductance component LH and a dc resistance component RH. The magnetic head driving circuit includes a switching circuit that is a parallel circuit made of first and second constant current switching circuits 22 and 23, and a conversion circuit 24 for converting pulsed drive current that is output current of the switching circuit into sine-wave current.

Figure 3:
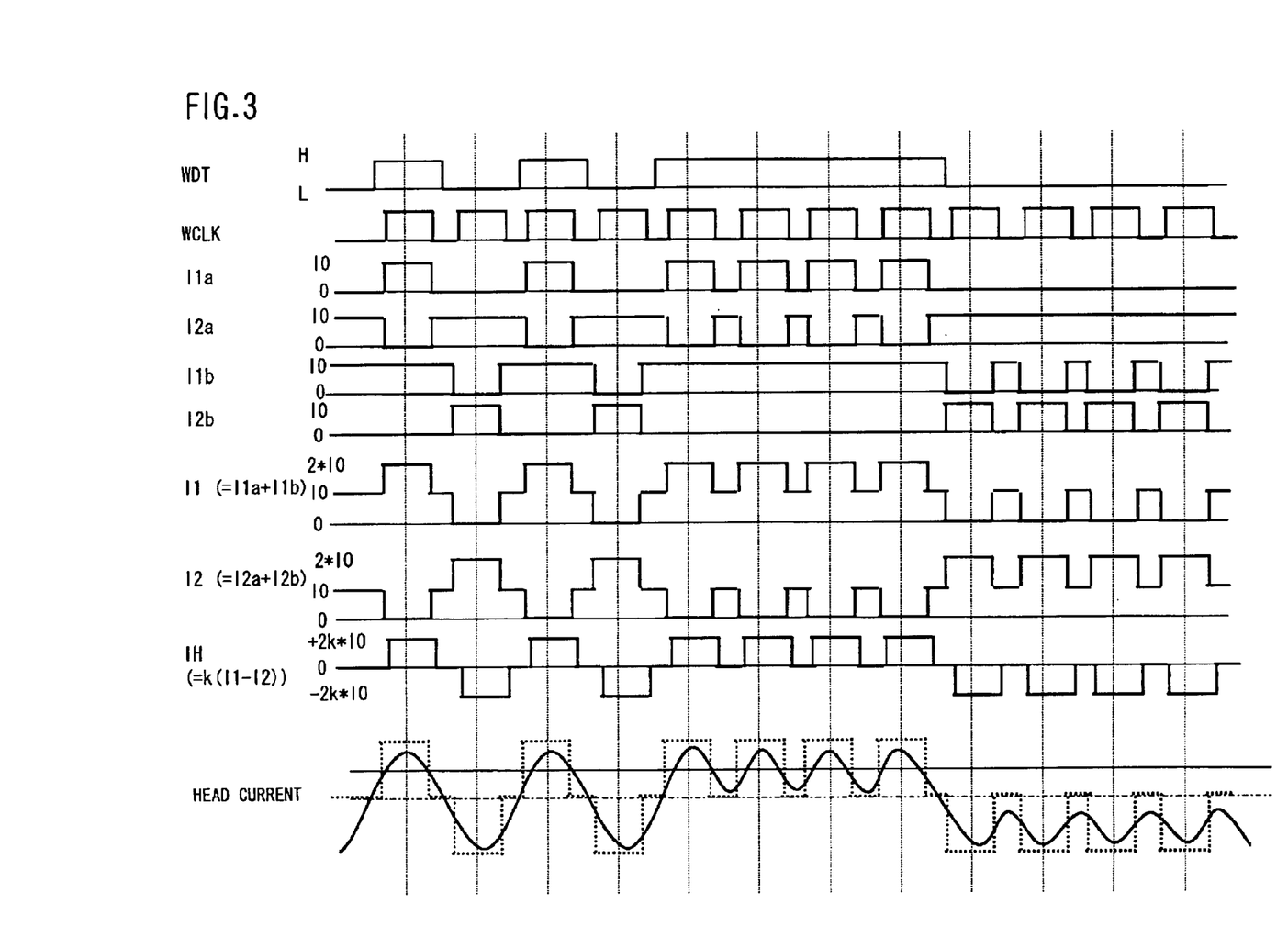
FIG. 3 shows waveforms of voltage or current in each portion of the magnetic head driving circuit shown in FIG. 2.

FIG. 3 shows waveforms of voltage or current in each portion of the magnetic head driving circuit shown in FIG. 2. This diagram of waveforms is referred to for explaining operations of the magnetic head driving circuit shown in FIG. 2.

As shown in FIG. 2, the first constant current switching circuit 22 includes a pair of transistors Tr1 and Tr2. A first constant current source (constant current I0) is connected between the ground and emitters of the transistors Tr1 and Tr2. Collectors of the transistors Tr1 and Tr2 are commonly connected to a power source voltage VH via a resistor RL. Switching pulses whose polarities are opposite to each other, which are generated by a first AND gate from the write data signal WDT and the write clock signal WCLK, are given to bases of the transistors Tr1 and Tr2, respectively. As a result, collector current I1a and collector current I2a whose polarities are opposite to each other flow through the transistors Tr1 and Tr2, respectively as shown in FIG. 3.

In addition, the second constant current switching circuit 23 includes a pair of transistors Tr3 and Tr4, and a second constant current source (constant current I0) is connected between the ground and emitters of the transistors Tr3 and Tr4. The collector of the transistor Tr3 is connected to the collector of the transistor Tr1 of the first constant current switching circuit 22, while the collector of the transistor Tr4 is connected to the collector of the transistor Tr2 of the first constant current switching circuit 22. Bases of the transistors Tr3 and Tr4 are supplied with switching pulses, respectively, which have opposite polarities and are generated by a second AND gate from the inverted signal *WDT of the write data signal and the write clock signal WCLK. As a result, collector current I1b and collector current I2b whose polarities are opposite to each other flow through the transistors Tr3 and Tr4, respectively as shown in FIG. 3.

As shown in FIG. 2, the collector current I1a of the transistor Tr1 of the first constant current switching circuit 22 and the collector current I1b of the transistor Tr3 of the second constant current switching circuit 23 make composite current I1. In the same way, the collector current I2a of the transistor Tr2 of the first constant current switching circuit 22 and the collector current I2b of the transistor Tr4 of the second constant current switching circuit 23 make composite current I2. Differential current IH of the composite current I1 and the composite current I2, which are composite current of the first and second constant current switching circuits 22 and 23 make drive current for the magnetic head 21.

The relationship of these current I1a, I1b, I1, I2a, I2b, I2 and IH are shown in FIG. 3. When the write clock signal WCLK is the low level, the constant current sources of the first and second constant current switching circuits 22 and 23 supply current I1 and I2 equally. When the write clock signal WCLK is the high level, the current is supplied by one of the constant current sources of the constant current switching circuits in accordance with the polarity of the write data signal WDT.

Figure 4:
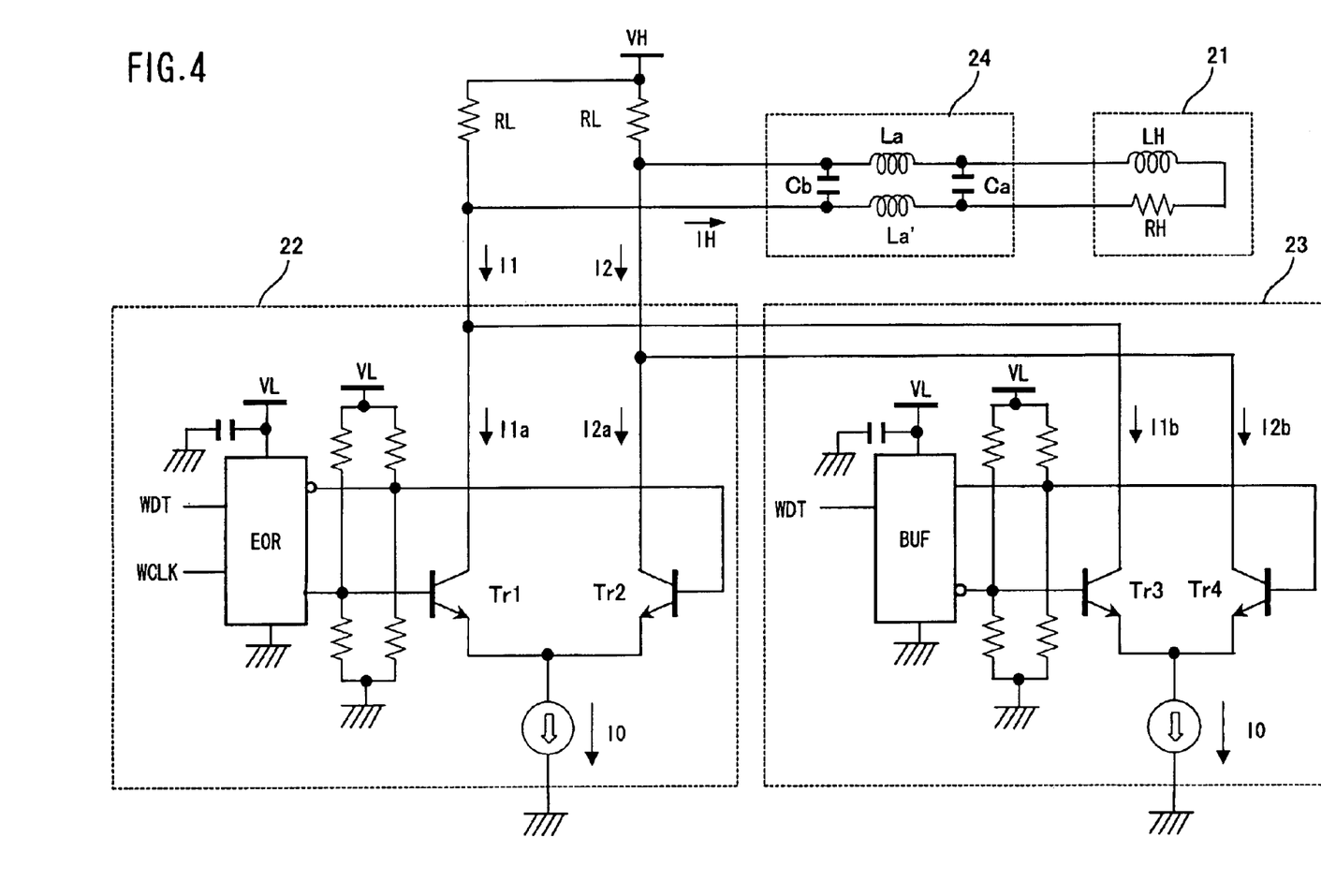
FIG. 4 is a schematic diagram of the magnetic head driving circuit according to a second embodiment of the present invention.
Figure 5:
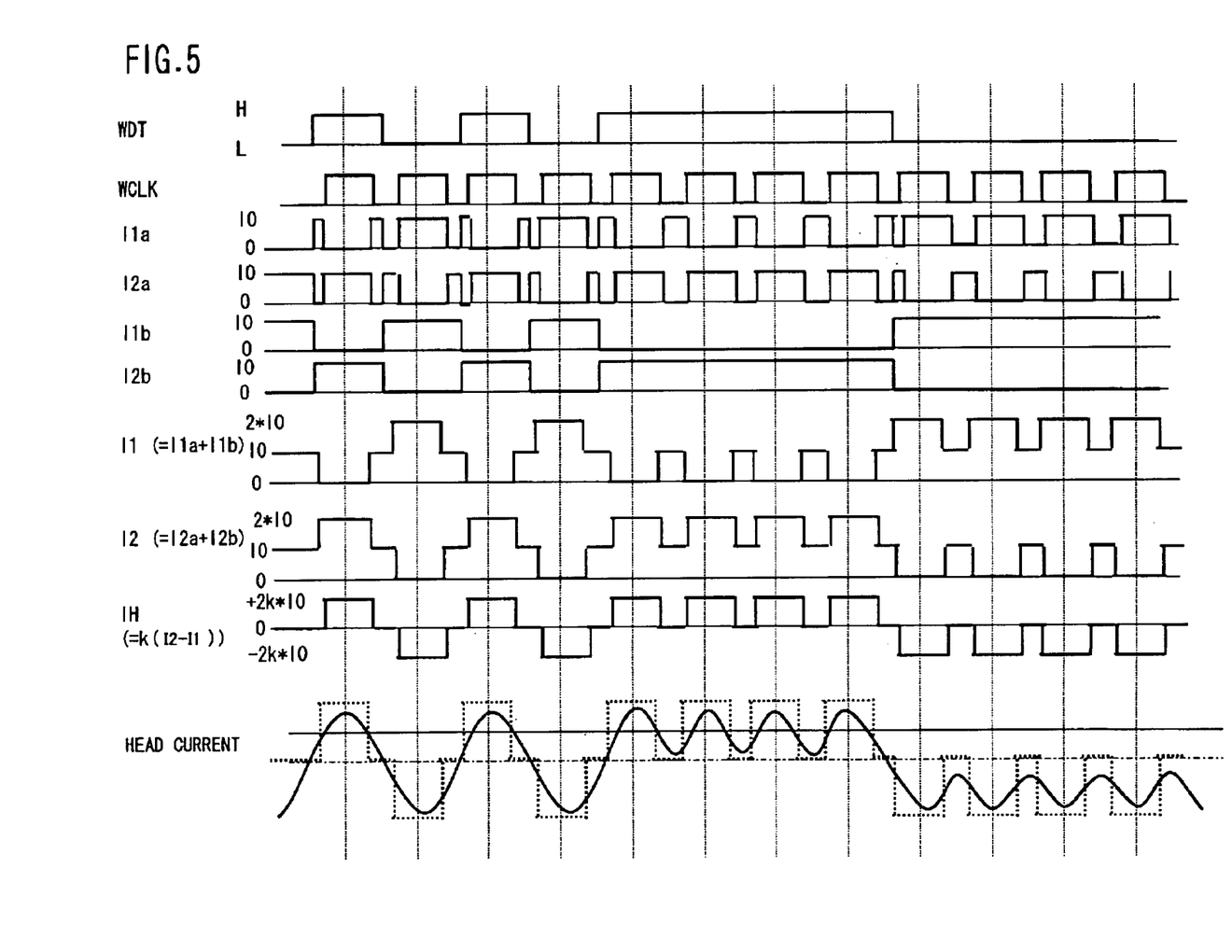
FIG. 5 shows waveforms of voltage or current in each portion of the magnetic head driving circuit shown in FIG. 4.

FIG. 4 is a schematic diagram of the magnetic head driving circuit according to a second embodiment of the present invention. FIG. 5 shows waveforms of voltage or current in each portion of the magnetic head driving circuit shown in FIG. 4. The first embodiment shown in FIG. 2 has a drawback that power consumption cannot be dispersed since only one of the first and second constant current switching circuits 22 and 23 is put under load when the write clock signal WCLK is the high level. The transistors Tr1–Tr4 usually consume power at a few watts. For example, if I0=100 mA and Vce=20 volts, the power consumption becomes 2 watt.

In the circuit structure of the second embodiment shown in FIG. 4, substantially equal drive current flows through the transistors of the first and second constant current switching circuits 22 and 23. More specifically, switching pulses that are generated by an EOR gate and have opposite polarities from the write data signal WDT and the write clock signal WCLK are given to bases of the transistors Tr1 and Tr2 of the first constant current switching circuit 22, respectively. In addition, switching pulses that are generated by a buffer gate (BUF) and have opposite polarities from the write data signal WDT are supplied to bases of the transistors Tr3 and Tr4 of the second constant current switching circuit 23.

Figure 6:
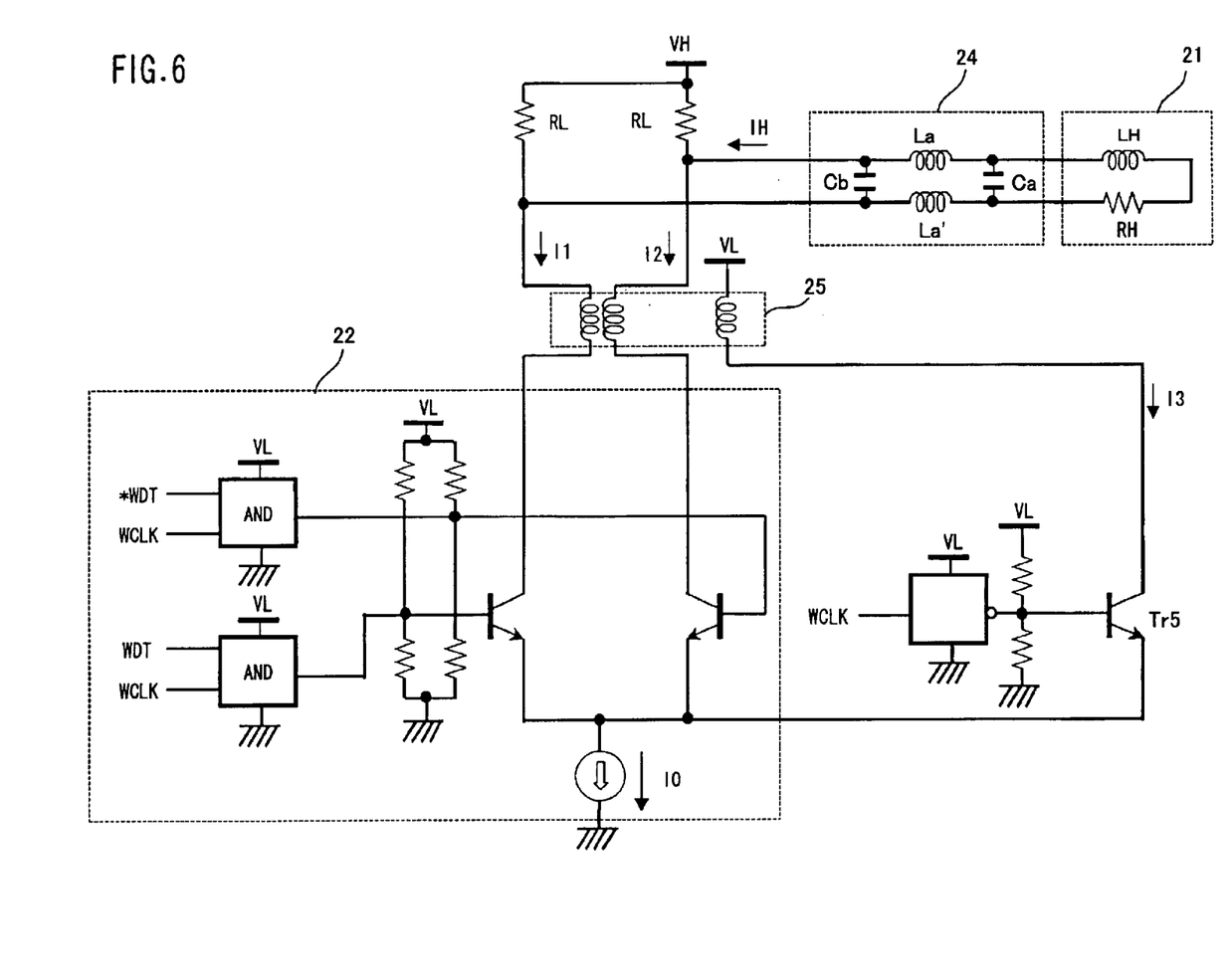
FIG. 6 is a schematic diagram of the magnetic head driving circuit according to a third embodiment of the present invention.

FIG. 6 is a schematic diagram of the magnetic head driving circuit according to a third embodiment of the present invention. In this circuit structure, a one-stage current switching circuit is provided so as to bypass the current when the write clock signal WCLK is the low level. In this case, the collector current I3 of the transistor Tr5 can be supplied by a power source voltage VL that is lower than the power source voltage VH. Thus, power consumption of the whole circuit can be reduced. However, since the composite current of the collector current I1 and I2 of the transistors Tr1 and Tr2 of the constant current switching circuit 22 is not constant, there is a problem that a common mode choke for preventing undesired radiation (EMI) cannot be inserted. In order to solve this problem, the collector current I3 of the transistor Tr5 supplied by the power source voltage VL is controlled by the write clock signal WCLK, so that the current flowing through the common mode choke 25 can be constant.

Figure 7A:
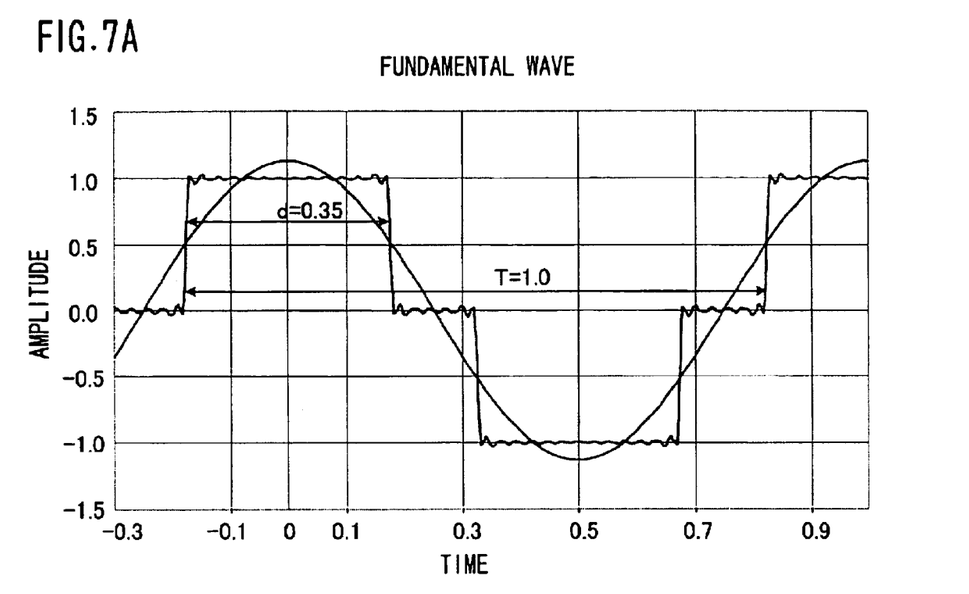
FIGS. 7A and 7B show the relationship between the pulse-like drive current waveform and a sine wave fundamental component.
Figure 7B:
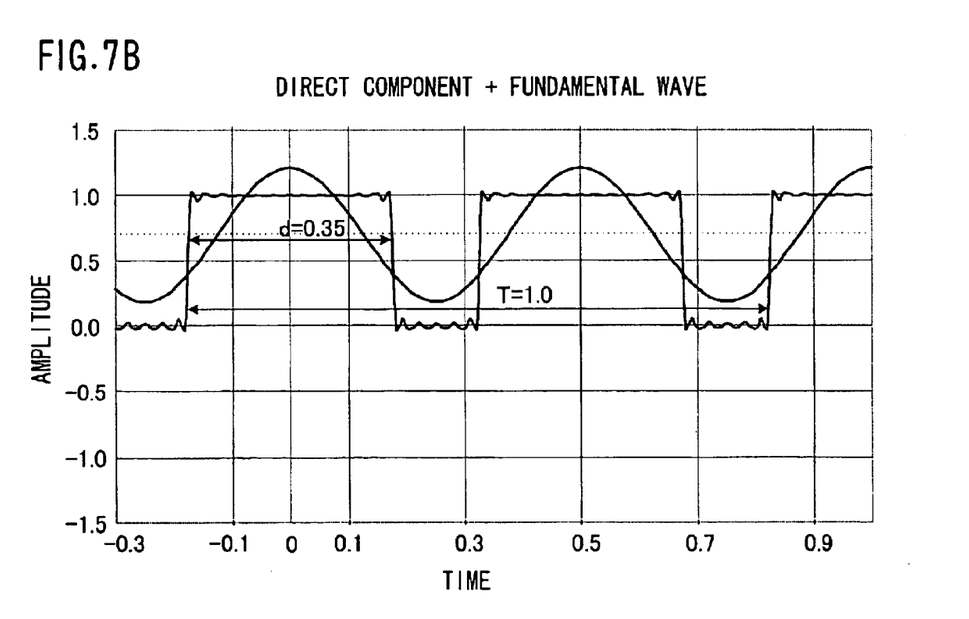

FIGS. 7A and 7B show the relationship between the pulse-like drive current waveform and a sine wave fundamental component. FIG. 7A is the case where direct component is zero, while FIG. 7B is the case where direct component is superposed. There is an area where a peak of the fundamental wave is lager than the amplitude of the pulse by approximately 20% both in the first pattern in which the drive current changes from positive to negative and in the second pattern in which the drive current changes from negative to positive. This is suitable for magneto-optic recording that requires magnetic field for a predetermined period, resulting in further reduction in the head current. For example, 80% current can reduce the power consumption to 64%.

According to the linear theory, the above-mentioned two patterns are sufficient for any random waveform. In this case, approximately 70–80% range of pulse generation period (d/T=0.35 in FIG. 7) has equal amplitude in the two patterns. However, the fundamental wave in the second pattern has a frequency twice as high as that of the fundamental wave of the first pattern, so the amplitude is reduced under an influence of filter attenuation characteristics of the conversion circuit 24. Therefore, the pulse width in approximately 60–80% range of the pulse generation period is practical though it depends on the filter characteristics.

As shown in FIGS. 2, 4 or 6, the pulse-like drive current supplied by the switching circuit is converted into sine-wave current by the conversion circuit 24 and becomes current flowing through the magnetic head 21. The conversion circuit 24 is an LC filter circuit including a pair of inductance elements La and La', and a pair of capacitance elements Ca and Cb. The inductance elements La and La' include wiring inductance of an FPC (a flexible print circuit board) for wiring. A capacitance element Cb of the driving circuit includes output capacitance of the transistors Tr1–Tr4. A capacitance element Ca of the magnetic head 21 side includes wiring capacitance of the FPC and other elements. A designing method of this conversion circuit 24 will be explained below.

Figure 8A:
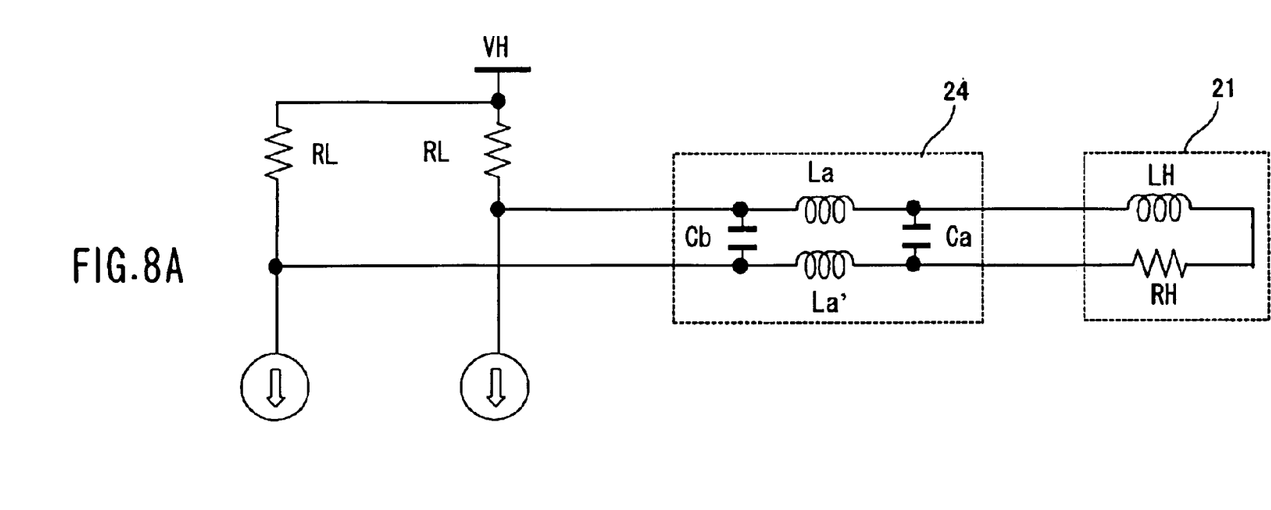
FIG. 8A shows an actual circuit of the driving circuit including the magnetic head and the conversion circuit.
Figure 8B:
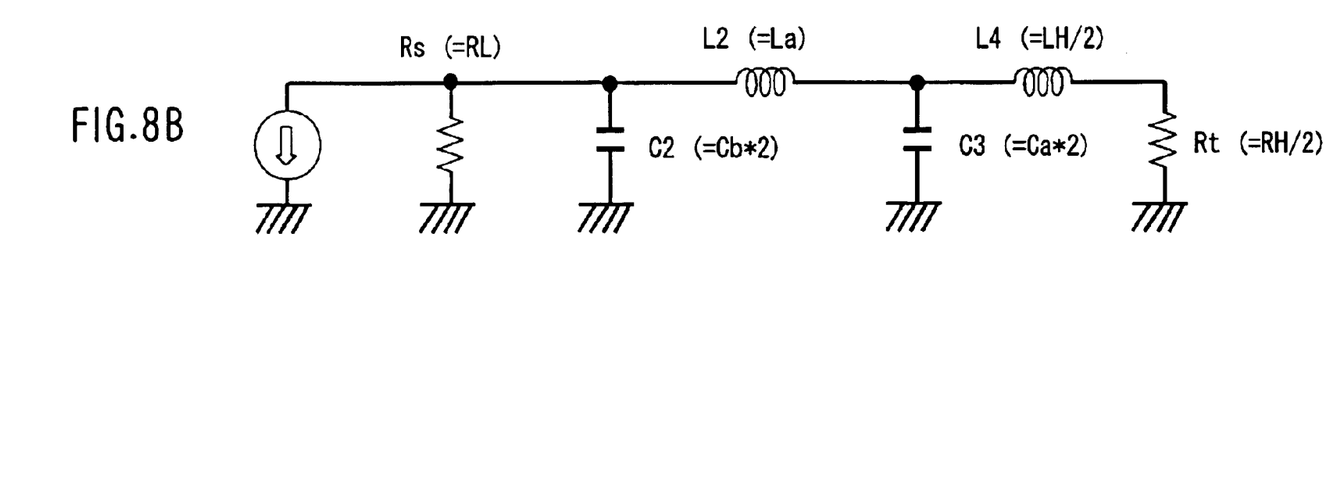
FIG. 8B shows a design circuit on the basis of theoretical values.

FIG. 8A shows an actual circuit of the driving circuit including the magnetic head 21 and the conversion circuit 24, while FIG. 8B shows a design circuit on the basis of theoretical values.

In order to control without changing the position at the peak current, it is desirable that the conversion circuit 24 is a phase linear type LC filter, which has constant delay time and little waveform distortion. Various forms are calculated in theory for the LC value. For example, in McGraw-Hill's "electronic filter" circuit designing handbook, pp 546 and 547, an example of constants for 0.05 degree phase ripple filter (Fc=½/π) is described as shown in FIG. 9.

Figure 9:
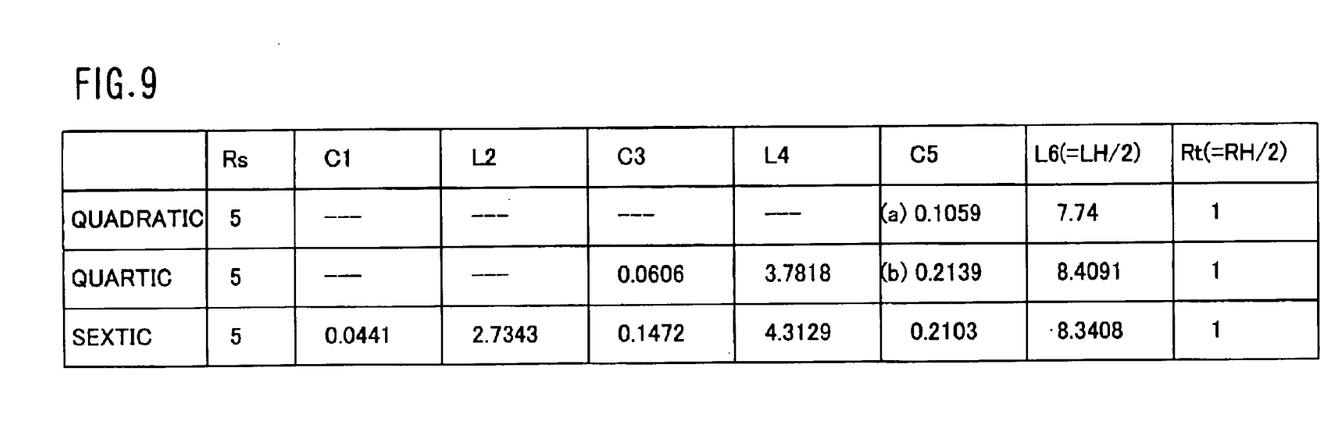
FIG. 9 is a table showing an example of constants for 0.05 degree phase ripple filter.

As understood from FIG. 9, a little large value (8.6%) is permitted as the inductance component LH of the magnetic head in the quartic of the same cut-off frequency. In addition, approximately double capacitance (that is (b)/(a) in FIG. 9) is permitted to capacitance C5. Since the capacitance C5 can be assigned to wiring capacitance (stray capacitance) FPC between the magnetic head and the driving circuit, it is large merit for mounting that a large value is permitted to the capacitance C5. Since capacitance C1 is very small for sextic, the condition such as output capacitance of the transistor in the driving circuit (the switching circuit) becomes strict. Therefore, it is suitable to set at quartic. Ratio Rs/Rt can be two, though allocation efficiency of the head current Ih is reduced.

Figure 10A:
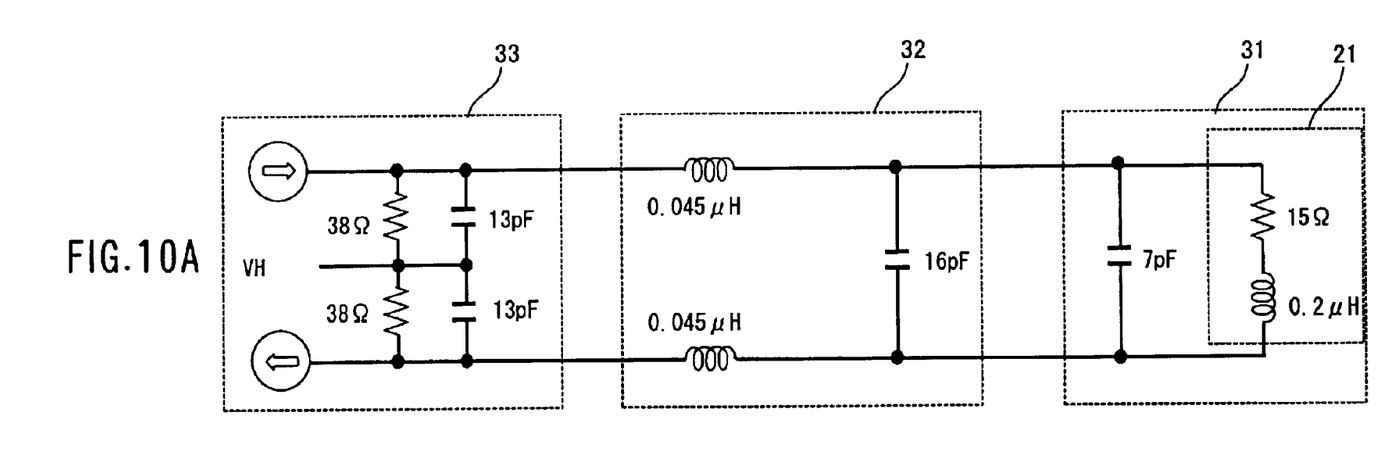
FIG. 10A shows an example of an actual circuit structure.
Figure 10B:
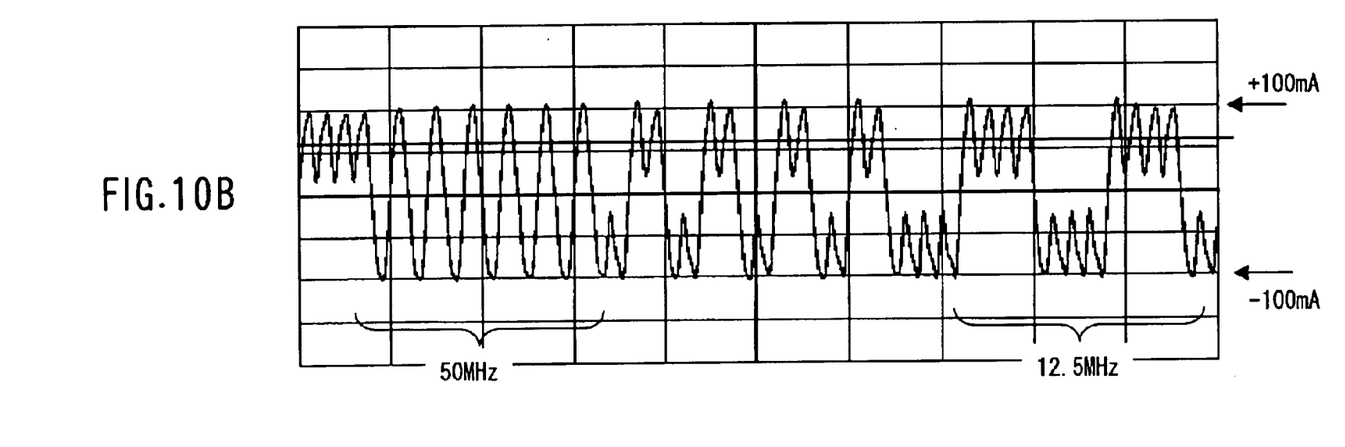
FIG. 10B shows a waveform as an experimental result of the example.

FIG. 10A shows an example of an actual circuit structure, and FIG. 10B shows a waveform as an experimental result of the example. In the actual circuit structure shown in FIG. 10A, a correction circuit 32 is inserted between a drive circuit (an equivalent circuit) 33 and a circuit 31 including the magnetic head 21 and the connecting FPC. The correction circuit 32 makes up the above-mentioned conversion circuit 24 together with the output capacitance of the transistor in the drive circuit 33 and the wiring capacitance of the FPC.

As shown in FIG. 10A, total capacitance of 6.6 pF including the series circuit made of two output capacitance elements of 13 pF of the transistor in the drive circuit 33 becomes the capacitance Cb on the driving circuit side of the above-mentioned conversion circuit 24. Furthermore, total capacitance of 23 pF including the capacitance 16 pF of the correction circuit 32 and the wiring capacitance 7 pF of the connecting FPC of the magnetic head 21 becomes the capacitance Ca on the magnetic head side of the conversion circuit 24.

The waveform shown in FIG. 10B is the head current flowing through the magnetic head 21 measured in the actual circuit as explained above. The average value (effective value) of the head current was approximately 70 mA, and the power consumption of the magnetic head 21 was approximately 74 mW (It was 150 mW in the case of direct current).

The specific values in each of the above-mentioned embodiments are merely an example. The present invention can be performed in various forms without being limited to the above-mentioned embodiments.

As explained above, according to the magnetic head driving method and the driving circuit for the magneto-optical disk drive of the present invention, the magnetic head is supplied with sine-wave current such that the maximum magnetic field is obtained at the timing for applying a pulse of light. Therefore, even if the magnetic head has large inductance, the power consumption can be reduced.

While the presently preferred embodiments of the present invention have been shown and described, it will be understood that the present invention is not limited thereto, and that various changes and modifications may be made by those skilled in the art without departing from the scope of the invention as set forth in the appended claims.

What is claimed is:

1. A method for driving a magnetic head that is used for modulating magnetic field in a magneto-optical disk drive, the method comprising the steps of:

detecting a timing for applying a pulse of light in accordance with a space between pits to be recorded on a magneto-optical disk; and supplying sine-wave current to the magnetic head so that the maximum magnetic field can be obtained at the timing for applying a pulse of light.

2. A driving circuit for a magnetic head that is used for modulating magnetic field in a magneto-optical disk drive, the driving circuit comprising:

a switching circuit for generating pulse-like drive current in synchronization with a timing for applying a pulse of light in accordance with a space between pits to be recorded on a magneto-optical disk; and a conversion circuit for converting the pulse-like drive current into sine-wave current such that the maximum magnetic field can be obtained at the timing for applying a pulse of light.

3. The driving circuit for a magnetic head according to claim 2, wherein the transfer function of the conversion circuit regarding the current flowing through the magnetic head toward the drive current forms a phase linear filter.

4. The driving circuit for a magnetic head according to claim 2, wherein the pulse width of the pulse-like drive current is 60–80% of pulse generation period.

5. The driving circuit for a magnetic head according to claim 2, wherein the switching circuit includes a plurality of constant current switching circuits connected in parallel and generates the drive current as composite current of a plurality of pulse current obtained from the constant current switching circuits.

6. The driving circuit for a magnetic head according to claim 5, wherein the drive current flows substantially equally through the transistors of constant current switching circuits connected in parallel.

7. The driving circuit for a magnetic head according to claim 5, wherein the switching circuit includes a common mode choke.

* * * * *